United States Patent
Chuang et al.

(10) Patent No.: US 11,887,893 B2
(45) Date of Patent: Jan. 30, 2024

(54) SEMICONDUCTOR SUBSTRATE AND METHOD OF MANUFACTURING THE SAME

(71) Applicant: GlobalWafers Co., Ltd., Hsinchu (TW)

(72) Inventors: Chih-Yuan Chuang, Hsinchu (TW); Walter Tony Wohlmuth, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 202 days.

(21) Appl. No.: 17/458,564

(22) Filed: Aug. 27, 2021

(65) Prior Publication Data
US 2022/0108924 A1 Apr. 7, 2022

(30) Foreign Application Priority Data
Oct. 6, 2020 (TW) ................................. 109134514

(51) Int. Cl.
 H01L 21/02 (2006.01)
 H01L 21/78 (2006.01)
 (Continued)

(52) U.S. Cl.
 CPC ...... H01L 21/7806 (2013.01); H01L 21/0254 (2013.01); H01L 21/02447 (2013.01);
 (Continued)

(58) Field of Classification Search
 CPC ........... H01L 21/7806; H01L 21/02447; H01L 21/02529; H01L 21/0254; H01L 21/76254; H01L 29/045; H01L 29/1608; H01L 29/2003; H01L 29/267; H01L 21/185; H01L 21/02433; H01L 21/0245; H01L 21/02502; H01L 21/02664; H01L 21/02002; H01L 21/26506; H01L 21/268;
 (Continued)

(56) References Cited

U.S. PATENT DOCUMENTS 6,974,760 B2 12/2005 Ghyselen et al.
8,575,651 B2 11/2013 Saxler et al.
(Continued)

FOREIGN PATENT DOCUMENTS

CN 100530544 C * 8/2009 ....... H01L 21/02378
CN 111433889 7/2020
(Continued)

*Primary Examiner* — Samuel Park
(74) *Attorney, Agent, or Firm* — JCIPRNET

(57) ABSTRACT

A semiconductor substrate and a method of manufacturing the same are provided. The method includes epitaxially growing a buffer layer and a silicon carbide layer on a silicon surface of an N-type silicon carbide substrate, and the silicon carbide layer is high-resistivity silicon carbide or N-type silicon carbide (N—SiC). Next, a gallium nitride epitaxial layer is epitaxially grown on the silicon carbide layer to obtain a semiconductor structure composed of the buffer layer, the silicon carbide layer, and the gallium nitride epitaxial layer. After the epitaxial growth of the gallium nitride epitaxial layer, a laser is used to form a damaged layer in the semiconductor structure, and a chip carrier is bonded to the surface of the gallium nitride epitaxial layer, and then the N-type silicon carbide and the semiconductor structure are separated at the location of the damaged layer.

20 Claims, 12 Drawing Sheets

(51) Int. Cl.
*H01L 29/04* (2006.01)
*H01L 29/16* (2006.01)
*H01L 29/20* (2006.01)
*H01L 29/267* (2006.01)
*H01L 21/762* (2006.01)

(52) U.S. Cl.
CPC .. *H01L 21/02529* (2013.01); *H01L 21/76254* (2013.01); *H01L 29/045* (2013.01); *H01L 29/1608* (2013.01); *H01L 29/2003* (2013.01); *H01L 29/267* (2013.01)

(58) Field of Classification Search
CPC ........... H01L 21/7813; H01L 21/02378; H01L 21/0262
See application file for complete search history.

(56) References Cited

U.S. PATENT DOCUMENTS

| 10,575,585 B2 * | 3/2020 | Kirk | A43B 3/0047 |
| 2015/0214040 A1 * | 7/2015 | Celler | H01L 27/1266 |
| | | | 438/459 |
| 2018/0053649 A1 | 2/2018 | Janzen et al. | |
| 2020/0135566 A1 * | 4/2020 | Aketa | H01L 21/7813 |

FOREIGN PATENT DOCUMENTS

| CN | 115207094 A * | 10/2022 | |
| JP | 5343910 B2 * | 11/2013 | ....... H01L 21/02378 |
| TW | I520331 | 2/2016 | |
| TW | I623656 | 5/2018 | |
| TW | I626340 | 6/2018 | |

* cited by examiner

SEMICONDUCTOR SUBSTRATE AND METHOD OF MANUFACTURING THE SAME

CROSS-REFERENCE TO RELATED APPLICATION

This application claims the priority benefit of Taiwan application serial no. 109134514, filed on Oct. 6, 2020. The entirety of the above-mentioned patent application is hereby incorporated by reference herein and made part of this specification.

BACKABRADED

Technology Field

The disclosure relates to a semiconductor manufacturing technology, and particularly to a semiconductor substrate and a method of manufacturing the same.

Description of Related Art

Epitaxy refers to the technology of growing new crystals on a wafer to form a semiconductor layer. Films formed by the epitaxial process have the advantages of high purity and good thickness control, so the films have been widely used in the manufacture of radio frequency (RF) components or power devices.

Originally, an epitaxial substrate is a silicon substrate on which gallium nitride is grown. However, it is discovered that silicon and gallium nitride have a problem of lattice mismatch. Recently, silicon carbide substrates have been replaced by silicon substrates to solve the problem of lattice mismatch.

However, the cost of the silicon carbide substrate is significantly higher than the cost of the silicon substrate, so it is not easy to strike the balance between the cost and the epitaxial quality.

SUMMARY

The disclosure provides a method of manufacturing a semiconductor substrate capable of solving both the problem of substrate lattice mismatch and the high substrate cost.

The disclosure provides another method of manufacturing a semiconductor substrate capable of manufacturing a substrate with high lattice matching at a lower cost.

The disclosure provides yet another semiconductor substrate adapted for radio frequency (RF) components and having good crystal quality.

The disclosure provides yet another semiconductor substrate adapted for power devices and having good crystal quality.

The method of manufacturing a semiconductor substrate of the disclosure includes the following steps. A buffer layer and a silicon carbide layer are epitaxially grown on a silicon surface of an N-type silicon carbide substrate, and the silicon carbide layer is high-resistivity silicon carbide or N-type silicon carbide (N—SiC). A gallium nitride epitaxial layer is epitaxially grown on the silicon carbide layer to obtain a semiconductor structure composed of the buffer layer, the silicon carbide layer, and the gallium nitride epitaxial layer. A laser is used to form a damaged layer in the semiconductor structure after epitaxially growing the gallium nitride epitaxial layer. A chip carrier is bonded on a surface of the gallium nitride epitaxial layer, and the N-type silicon carbide substrate and the semiconductor structure are separated at where the damaged layer is disposed.

In an embodiment of the disclosure, the method of forming the damaged layer includes applying the laser to the buffer layer from the surface of the gallium nitride epitaxial layer to form the damaged layer in the buffer layer.

In an embodiment of the disclosure, the method of forming the damaged layer includes applying the laser from a carbon surface of the N-type silicon carbide substrate to the silicon surface of the N-type silicon carbide substrate to form the damaged layer in the N-type silicon carbide substrate.

In an embodiment of the disclosure, a laser lift off (LLO) layer is further epitaxially grown after the buffer layer is epitaxially grown and before the silicon carbide layer is epitaxially grown. The laser lift off (LLO) layer is silicon carbide doped with aluminum, a concentration of the doped aluminum of the laser lift off (LLO) layer is greater than 1E20 cm-3, for example, and a thickness of the laser lift off (LLO) layer ranges from 1.0 nm to 10 nm, for example.

In an embodiment of the disclosure, the method of forming the damaged layer includes applying the laser to the laser lift off (LLO) layer from a carbon surface of the N-type silicon carbide substrate to form the damaged layer in the laser lift off (LLO) layer.

Another method of manufacturing a semiconductor substrate of the disclosure includes the following steps. Ion implantation is used to form a damaged layer on a silicon surface of an N-type silicon carbide substrate. A buffer layer and a silicon carbide layer are epitaxially grown on the silicon surface of the N-type silicon carbide substrate after the damaged layer is formed, and the silicon carbide layer is high-resistivity silicon carbide or N-type silicon carbide (N—SiC). Next, a gallium nitride epitaxial layer is epitaxially grown on the silicon carbide layer to obtain a semiconductor structure composed of the buffer layer, the silicon carbide layer, and the gallium nitride epitaxial layer. A chip carrier is bonded on a surface of the gallium nitride epitaxial layer, and then the N-type silicon carbide substrate and the semiconductor structure are separated at where the damaged layer is disposed.

In the embodiment of the disclosure, the silicon surface of the N-type silicon carbide substrate has an angle ranging from 0° to +/−8° with respect to a (0001) surface.

In the embodiment of the disclosure, after separating the N-type silicon carbide substrate and the semiconductor structure, the method further includes removing the buffer layer.

In the embodiment of the disclosure, the method further includes bonding a supporting substrate to the buffer layer or a surface of the silicon carbide layer, and the supporting substrate includes a silicon substrate, a silicon-on-insulator (SOI) substrate, a ceramic substrate, or a glass substrate.

In the embodiment of the disclosure, after bonding the supporting substrate, the the chip carrier is further removed.

In the embodiment of the disclosure, a material of the chip carrier includes glass or sapphire.

A semiconductor substrate of the disclosure includes a high-resistivity silicon carbide layer and a gallium nitride epitaxial layer. The high-resistivity silicon carbide layer includes a first surface and a second surface opposite to the first surface. The gallium nitride epitaxial layer is formed on the second surface of the high-resistivity silicon carbide layer, a thickness of the gallium nitride epitaxial layer is less than 2 μm, and a full width at half maximum (FWHM) of an X-ray diffraction analysis (002) plane is less than 100 arcsec. The thickness of the high-resistivity silicon carbide layer ranges from 20 μm to 50 μm, the second surface of the high-resistivity silicon carbide layer has an angle ranging from 0° to +/−8° with respect to a (0001) plane, a micropipe density (MPD) of the high-resistivity silicon carbide layer is less than 0.5 ea/cm$^2$, basal plane dislocation (BPD) of the high-resistivity silicon carbide layer is less than 10 ea/cm$^2$, and threading screw dislocation (TSD) of the high-resistivity silicon carbide layer is less than 500 ea/cm$^2$.

In yet another embodiment of the disclosure, the resistance of the high-resistivity silicon carbide layer is greater than 1E5 ohm-cm.

In yet another embodiment of the disclosure, the resistance variation rate of the high-resistivity silicon carbide layer is less than 50%.

In yet another embodiment of the disclosure, the semiconductor substrate further includes a buffer layer, which is in direct contact with the first surface of the high-resistivity silicon carbide layer.

In yet another embodiment of the disclosure, the thickness of the buffer layer is less than 1.5 μm.

In yet another embodiment of the disclosure, the semiconductor substrate further includes a laser lift off (LLO) layer, which is in direct contact with the first surface of the high-resistivity silicon carbide layer.

In yet another embodiment of the disclosure, the laser lift off (LLO) layer is silicon carbide doped with aluminum.

In yet another embodiment of the disclosure, the concentration of the doped aluminum of the laser lift off (LLO) layer is greater than 1E20 cm$^{-3}$, and the thickness of the laser lift off (LLO) layer ranges from 1.0 nm to 10 nm.

In yet another embodiment of the disclosure, the semiconductor substrate further includes a supporting substrate bonded to an exposed surface of a material layer, wherein the supporting substrate comprises a silicon substrate, a silicon-on-insulator (SOI) substrate, a ceramic substrate, or a glass substrate.

A yet another semiconductor substrate includes an N-type silicon carbide (N—SiC) layer; and a gallium nitride epitaxial layer. The gallium nitride epitaxial layer is formed on a surface of the N-type silicon carbide (N—SiC) layer, the thickness of the gallium nitride epitaxial layer ranges from 0.3 μm to 6 μm, and a full width at half maximum (FWHM) of an X-ray diffraction analysis (002) plane is less than 100 arcsec. The thickness of the N-type silicon carbide (N—SiC) layer ranges from 0.1 μm to 50 μm, and the surface of the N-type silicon carbide (N—SiC) layer comprises an angle ranging from 0° to +/−8° with respect to a (0001) plane. A micropipe density (MPD) of the N-type silicon carbide (N—SiC) layer is less than 0.5 ea/cm$^2$, basal plane dislocation (BPD) of the N-type silicon carbide (N—SiC) layer is less than 10 ea/cm$^2$, and threading screw dislocation (TSD) of the N-type silicon carbide (N—SiC) layer is less than 500 ea/cm$^2$.

In a yet still embodiment of the disclosure, the resistance of the N-type silicon carbide (N—SiC) layer ranges from 1E15 cm$^{-3}$ to 1E20 cm$^{-3}$.

In a yet still embodiment of the disclosure, the resistance variation rate of the N-type silicon carbide (N—SiC) layer is less than 5%.

In a yet still embodiment of the disclosure, the semiconductor substrate further includes a supporting substrate bonded to an exposed surface of the N-type silicon carbide (N—SiC) layer. The supporting substrate includes a silicon substrate, a silicon-on-insulator (SOI) substrate, a ceramic substrate, or a glass substrate.

Based on the above, the method of the disclosure is capable of manufacturing a substrate with good crystallinity and reducing the cost of the substrate by reusing the silicon carbide substrate.

In order to make the above-mentioned features and advantages of the disclosure more comprehensible, the following specific embodiments are described in detail in conjunction with the accompanying drawings.

DESCRIPTION OF THE EMBODIMENTS

Figure 1A:
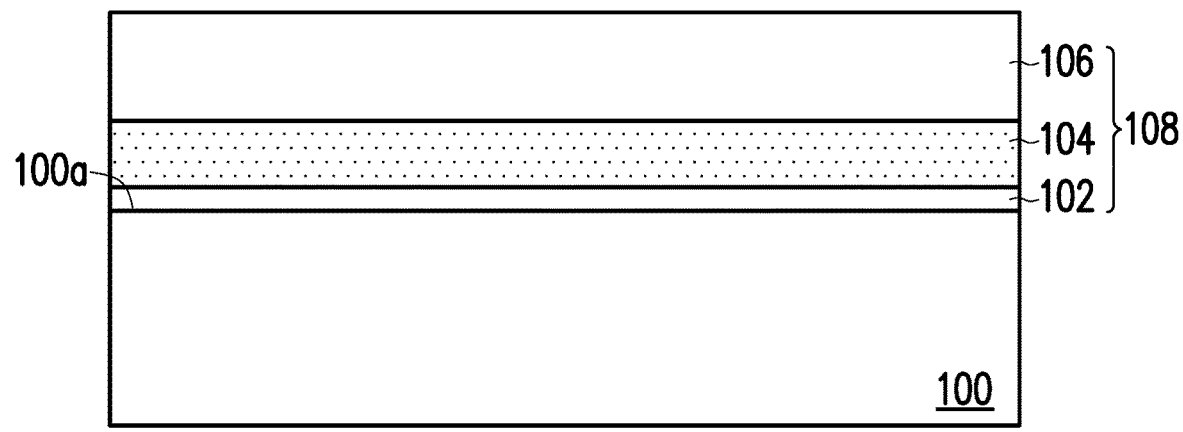
FIG. 1A to FIG. 1E are schematic cross-sectional views of manufacturing a semiconductor substrate according to a first embodiment of the disclosure.

The exemplary embodiments of the disclosure will be fully described below with reference to the drawings, but the disclosure may also be implemented in many different forms and should not be construed as being limited to the embodiments described herein. In the drawings, for the sake of clarity, the size and thickness of each region, location, and layer may not be drawn to actual scale. To facilitate understanding, the same elements in the following description will be described with the same symbols.

FIG. 1A to FIG. 1E are schematic cross-sectional views of manufacturing a semiconductor substrate according to a first embodiment of the disclosure.

Referring to FIG. 1A, a buffer layer 102 and a silicon carbide layer 104 are epitaxially grown on a silicon surface 100a of an N-type silicon carbide substrate 100. The thickness of the N-type silicon carbide substrate 100 ranges from 300 μm to 725 μm, for example. The angle of the silicon surface 100a of the N-type silicon carbide substrate 100 with respect to the (0001) surface ranges from 0° to +/−8°, such as from 0° to +/−5°, preferably from 0° to +/−3°, and 0° the best. The micropipe density (MPD) of the N-type silicon carbide substrate 100 is less than 1 ea/cm$^2$, the basal plane dislocation (BPD) of the N-type silicon carbide substrate 100 is less than 3000 ea/cm$^2$, and the threading screw dislocation (TSD) of the N-type silicon carbide substrate 100 is less than 1000 ea/cm$^2$. The resistance of the N-type silicon carbide substrate 100 ranges approximately from 15 mohm-cm to 26 mohm-cm. The buffer layer 102 is silicon carbide with low resistance and with a single crystal structure. The silicon carbide layer 104 is high-resistivity silicon carbide or N-type silicon carbide (N—SiC). The silicon carbide layer 104 of a high-resistivity silicon carbide (e.g., semi-insulating silicon carbide) is adapted for semiconductor substrates with radio frequency (RF) components. On the other hand, the silicon carbide layer 104 of an N-type silicon carbide is adapted for semiconductor substrates with power devices. The thickness of the silicon carbide layer 104 can be set between 0.1 μm and 50 μm. Moreover, the surface of the silicon carbide layer 104 has an angle ranging from 0° to +/−8°, an angle ranging from 0° to +/−5°, or an angle ranging from 0° to +/−3° with respect to the (0001) plane, for example, the micropipe density (MPD) of the silicon carbide layer 104 can be less than 0.5 ea/cm$^2$, the basal plane dislocation (BPD) of the silicon carbide layer 104 can be less than 10 ea/cm$^2$, and the threading screw dislocation (TSD) of the silicon carbide layer 104 can be less than 500 ea/cm$^2$. In one embodiment, the resistance of the silicon carbide layer 104 of high-resistivity silicon carbide is greater than 1E5 ohm-cm, for example. In another embodiment, the resistance of the silicon carbide layer 104 of N-type silicon carbide (N—SiC) ranges from 1E15 cm$^{-3}$ to 1E20 cm$^{-3}$, for example. Next, a gallium nitride epitaxial layer 106 is epitaxially grown on the silicon carbide layer 104 to obtain a semiconductor structure 108 composed of the buffer layer 102, the silicon carbide layer 104, and the gallium nitride epitaxial layer 106.

Figure 1B:
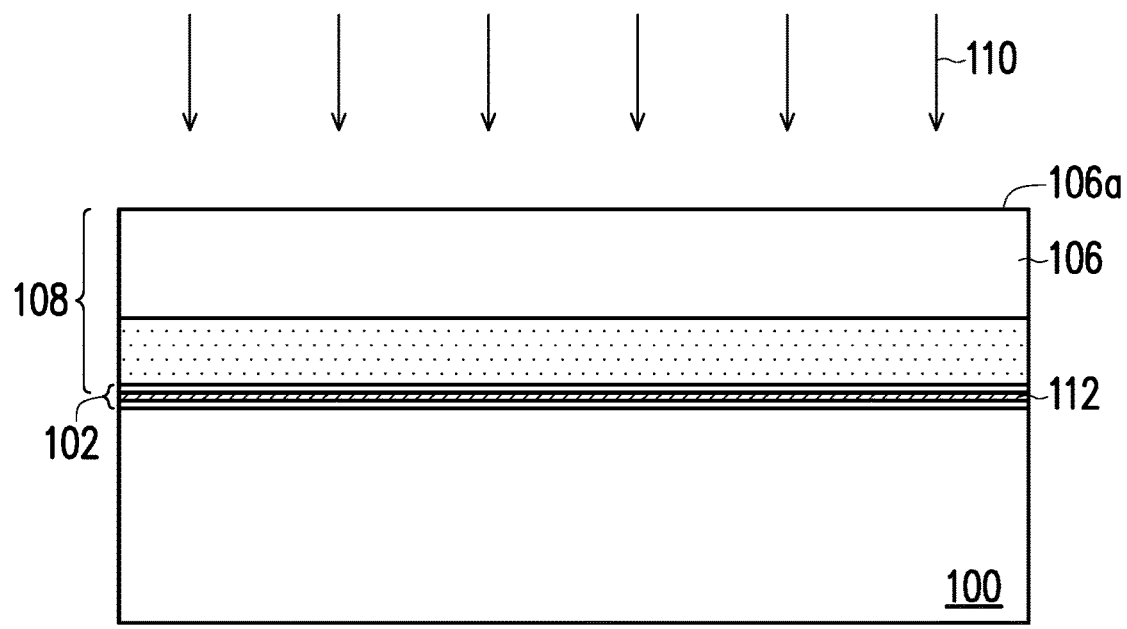

Next, referring to FIG. 1B, after the gallium nitride epitaxial layer 106 is epitaxially grown, a laser 110 is used to form a damaged layer 112 in the semiconductor structure 108. In the embodiment, the laser 110 is applied to the buffer layer 102 from a surface 106a of the gallium nitride epitaxial layer 106 to form the damaged layer 112 in the buffer layer 102.

Figure 1C:
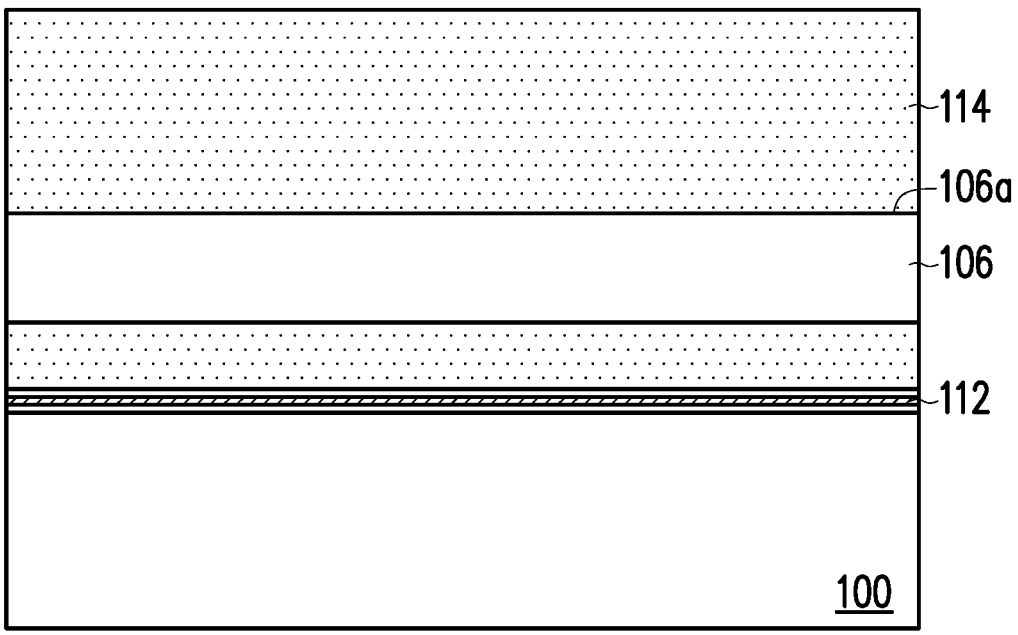

Next, referring to FIG. 1C, a chip carrier 114 is bonded to the surface 106a of the gallium nitride epitaxial layer 106, and the material of the chip carrier 114 includes glass or sapphire.

Figure 1D:
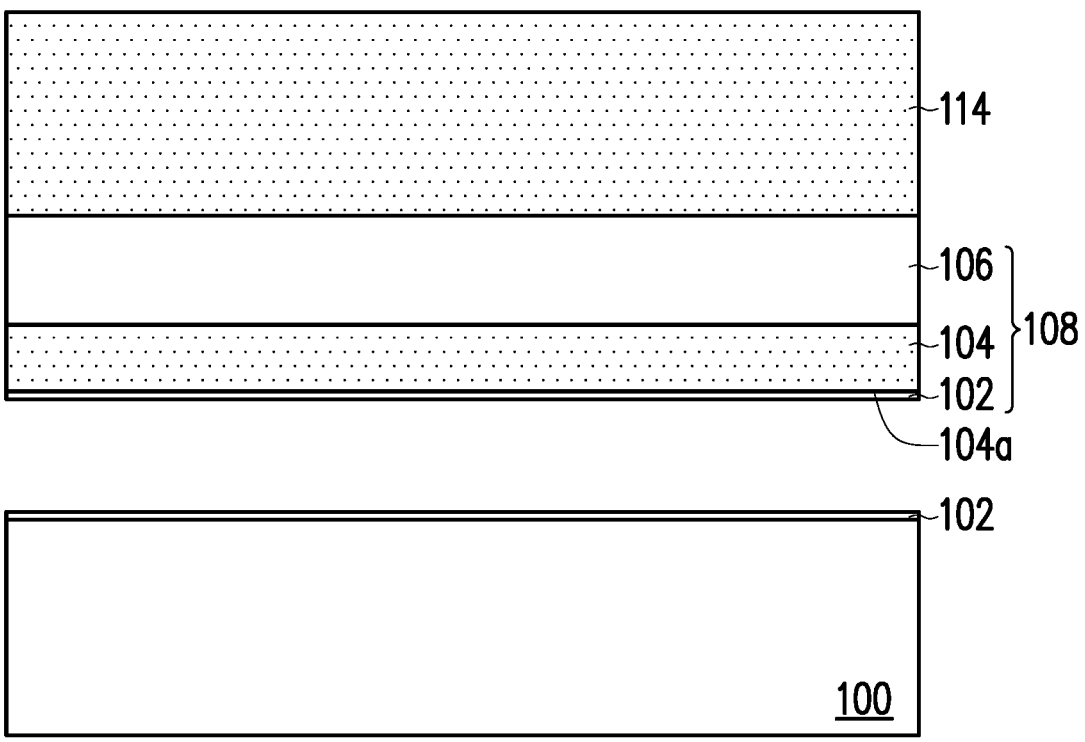

Subsequently, referring to FIG. 1D, the N-type silicon carbide substrate 100 and the semiconductor structure 108 are separated at the location of the damaged layer (112), and part of the buffer layer 102 may be left on the carbon surface 104a of the silicon carbide layer 104. Therefore, in one embodiment, the buffer layer 102 can be left. In another embodiment, the buffer layer 102 requires abrasion.

Figure 1E:
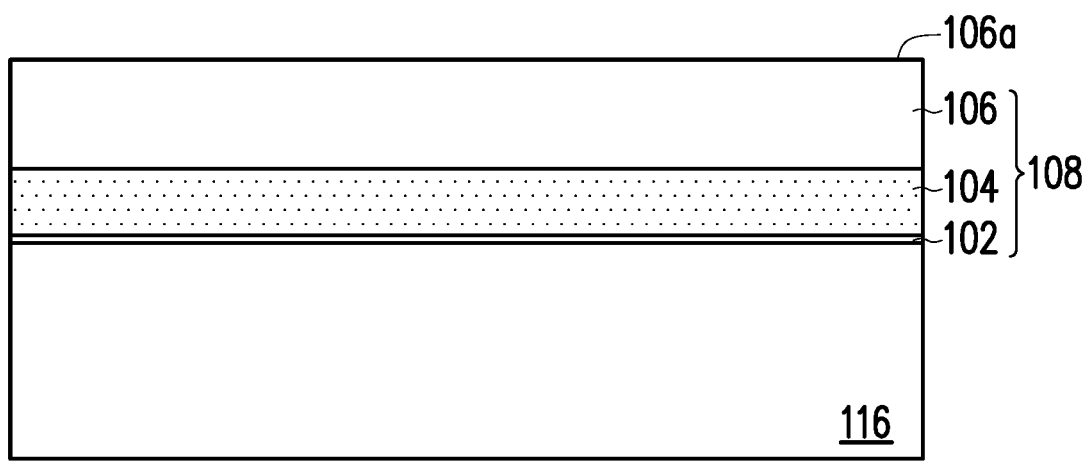

Next, referring to FIG. 1E, in response to subsequent requirements, a supporting substrate 116 can be optionally bonded to the surface of the buffer layer 102 to facilitate subsequent movement and fixation of the entire semiconductor substrate. The supporting substrate 116 is a silicon substrate, a silicon-on-insulator (SOI) substrate, a ceramic substrate, or a glass substrate, for example. On the other hand, if the buffer layer has been abraded, the supporting substrate 116 can be bonded to the surface of the silicon carbide layer 104. Moreover, after the supporting substrate 116 is bonded, the chip carrier (114) may be removed to form a radio frequency component or a power component from the exposed surface 106a of the gallium nitride epitaxial layer 106.

In the manufacturing process of the first embodiment, the laser 110 is used to form the damaged layer 112 for separation in the buffer layer 102 after the gallium nitride epitaxial layer 106 is grown, so not only the crystallinity quality of the silicon carbide layer 104 and the gallium nitride epitaxial layer 106 can be guaranteed, but also the complete silicon carbide layer 104 and the N-type silicon carbide substrate 100 can be retained. Therefore, the separated N-type silicon carbide substrate 100 can be reused, and the material cost is greatly reduced.

FIG. 2A to FIG. 2D are schematic cross-sectional views of manufacturing a semiconductor substrate according to a second embodiment of the disclosure. The same or similar components are illustrated by the same numeral reference numbers as those in the first embodiment. Refer to the relevant description of the first embodiment for the description of the same or similar components, which is not iterated herein.

Figure 2A:
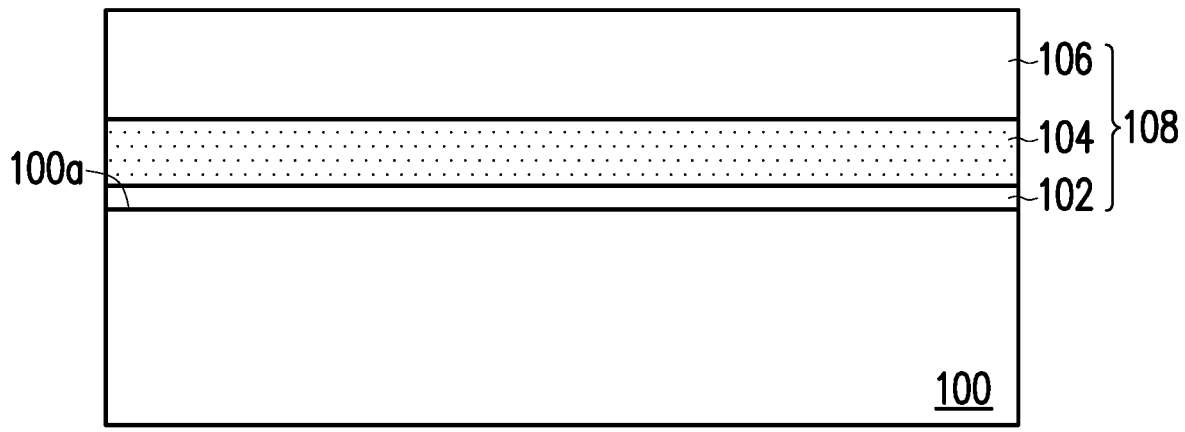
FIG. 2A to FIG. 2D are schematic cross-sectional views of manufacturing a semiconductor substrate according to a second embodiment of the disclosure.

Referring to FIG. 2A, a buffer layer 102 and a silicon carbide layer 104 are epitaxially grown on the silicon surface 100a of an N-type silicon carbide substrate 100, and next a gallium nitride epitaxial layer 106 is epitaxially grown on the silicon carbide layer 104 to obtain a semiconductor structure 108 composed of the buffer layer 102, the silicon carbide layer 104, and the gallium nitride epitaxial layer 106.

Figure 2B:
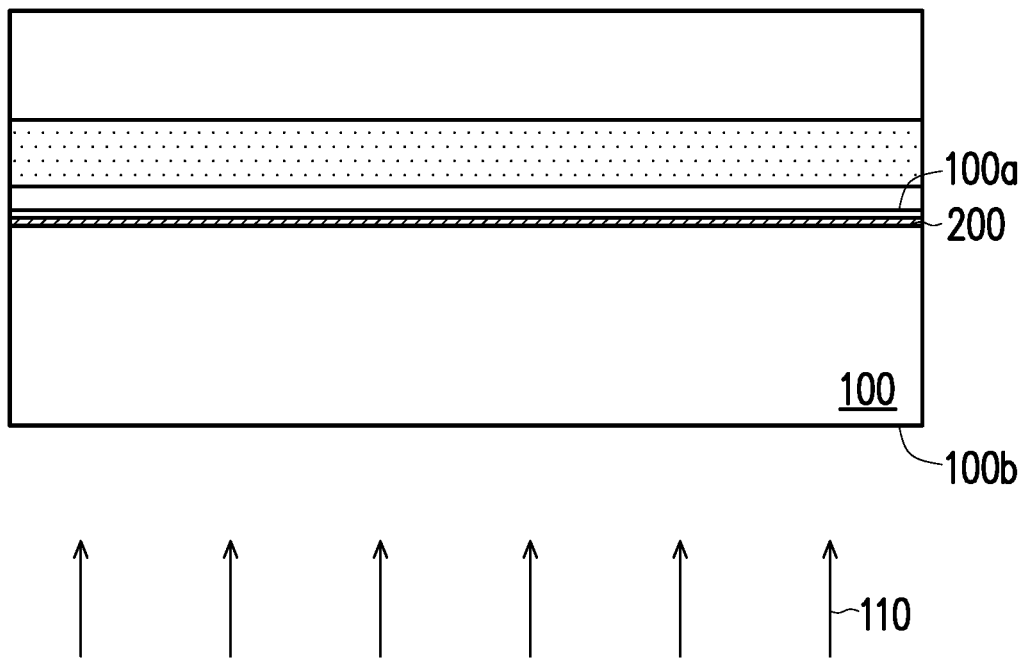

Next, referring to FIG. 2B, in the embodiment, a laser is applied from the carbon surface 100b of the N-type silicon carbide substrate 100 to the silicon surface 100a of the N-type silicon carbide substrate 100 to form the damaged layer 200 in the N-type silicon carbide substrate 100.

Figure 2C:
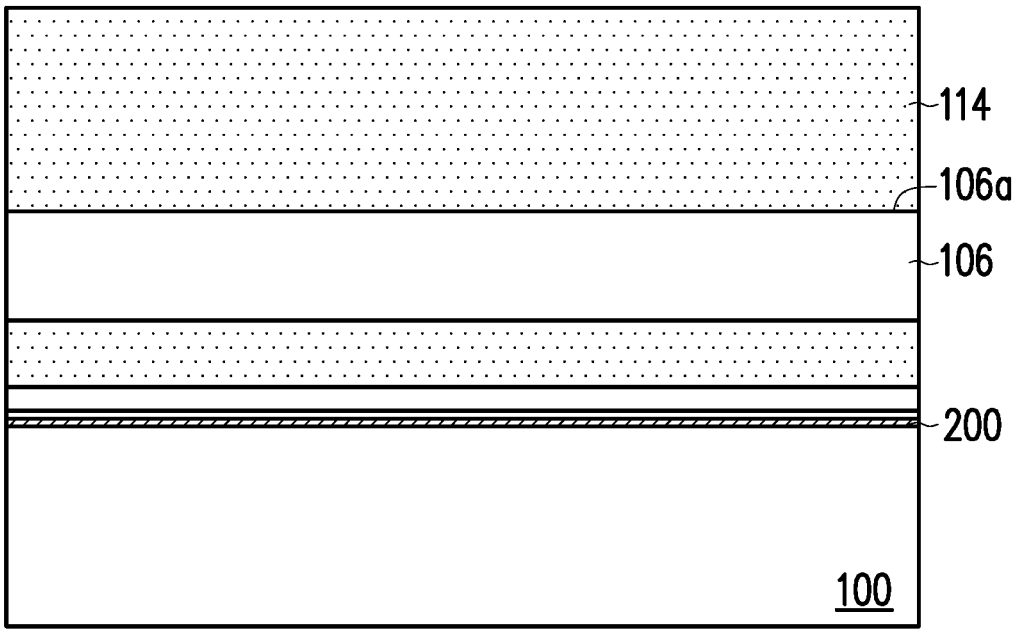

Then, referring to FIG. 2C, a chip carrier 114 is bonded to the surface 106a of the gallium nitride epitaxial layer 106.

Figure 2D:
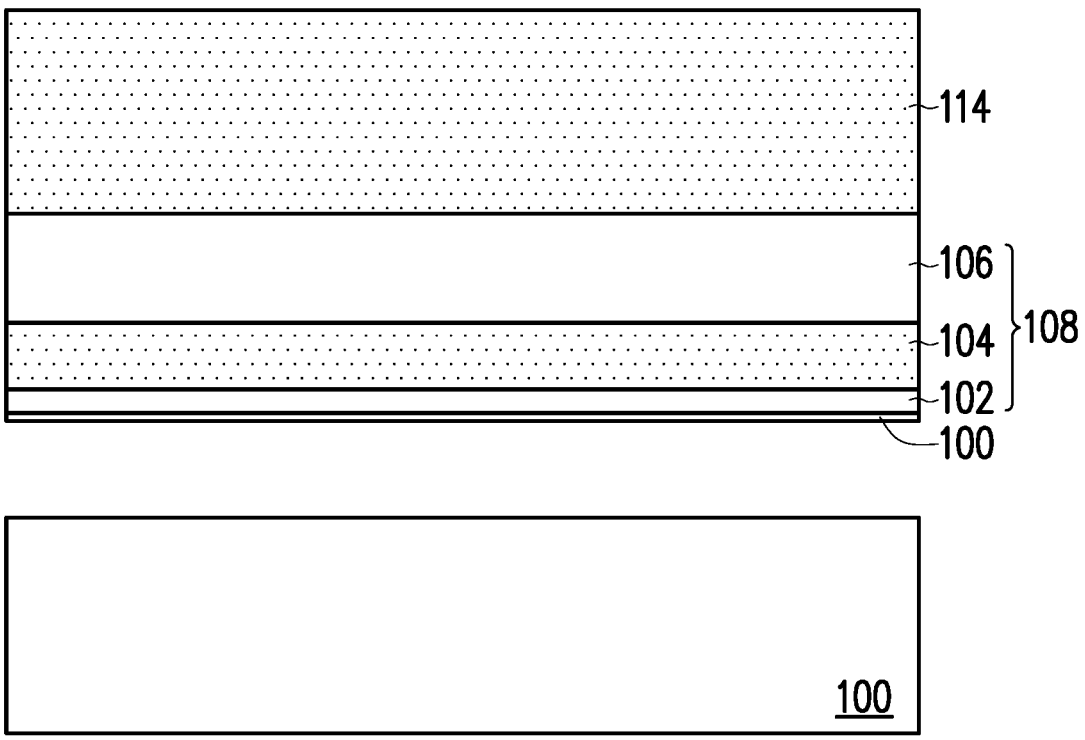

Subsequently, referring to FIG. 2D, the N-type silicon carbide substrate 100 and the semiconductor structure 108 are separated at the location of the damaged layer (200), and part of the N-type silicon carbide substrate 100 may be left on the buffer layer 102. Therefore, in one embodiment, the buffer layer 102 can be retained. In another embodiment, abrasion is required to remove the left N-type silicon carbide substrate 100 and the left buffer layer 102. Moreover, if necessary, the steps shown in FIG. 1E may be performed, that is, the step of bonding a supporting substrate (not shown) and the step of removing the chip carrier 114.

In the manufacturing process of the second embodiment, the laser 110 is used to form the damaged layer 200 for separation in the N-type silicon carbide substrate 100 after the gallium nitride epitaxial layer 106 is grown, so not only the crystallinity quality of the silicon carbide layer 104 and the gallium nitride epitaxial layer 106 can be guaranteed, but also the complete silicon carbide layer 104 is retained. Moreover, since the laser 110 can control the precise location where the damaged layer 200 is formed, a majority of the N-type silicon carbide substrate 100 can be retained as much as possible, the separated N-type silicon carbide substrate 100 can be reused, and the material cost is greatly reduced.

FIG. 3A to FIG. 3D are schematic cross-sectional views of manufacturing a semiconductor substrate according to a third embodiment of the disclosure. The same or similar components are illustrated by the same numeral reference numbers as those in the first embodiment. Refer to the relevant description of the first embodiment for the description of the same or similar components, which is not iterated herein.

Figure 3A:
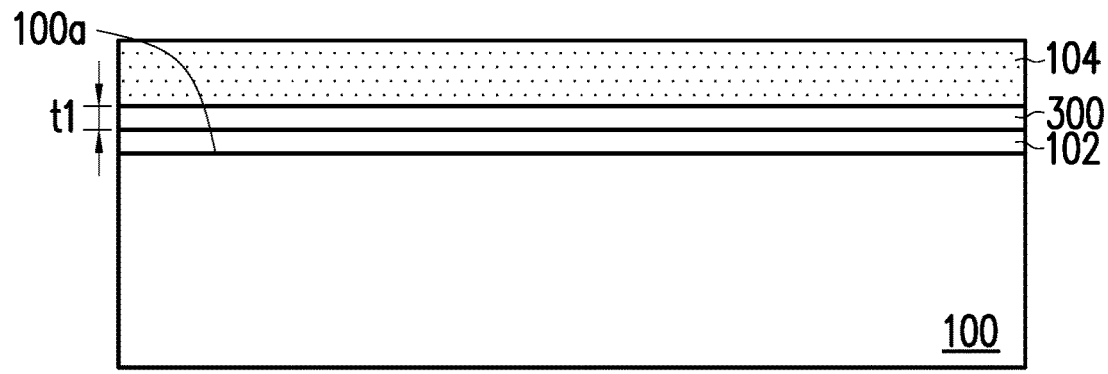
FIG. 3A to FIG. 3D are schematic cross-sectional views of manufacturing a semiconductor substrate according to a third embodiment of the disclosure.

Referring to FIG. 3A, a buffer layer 102 is epitaxially grown on the silicon surface 100a of an N-type silicon carbide substrate 100, and then a laser lift off (LLO) layer 300 is epitaxially grown. The LLO layer 300 is silicon carbide doped with aluminum, the concentration of the doped aluminum of the LLO layer 300 is above 1E20 cm$^{-3}$, for example, and the thickness t1 of the LLO layer 300 ranges from 1.0 nm to 10 nm, for example. Then, a silicon carbide layer 104 is epitaxially grown on the LLO layer 300.

Figure 3B:
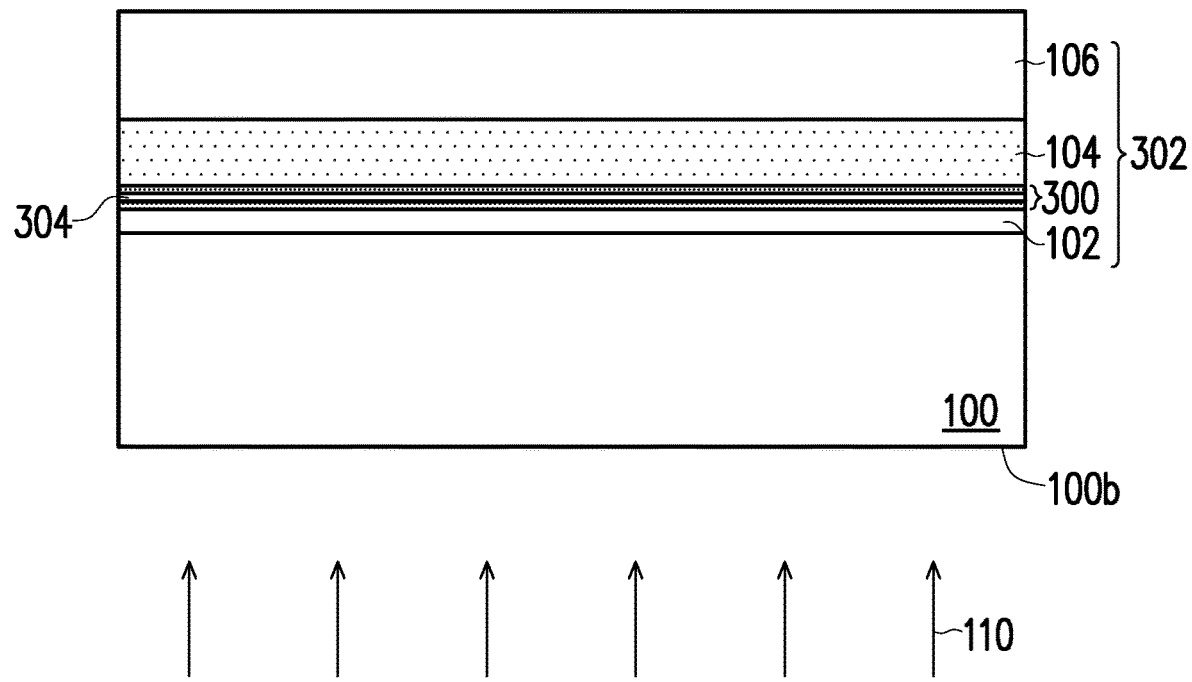

Next, referring to FIG. 3B, a gallium nitride epitaxial layer 106 is epitaxially grown on the silicon carbide layer 104 to obtain a semiconductor structure 302 composed of the buffer layer 102, the LLO layer 300, the silicon carbide layer 104, and the gallium nitride epitaxial layer 106. Then, a laser 110 is applied to the LLO layer 300 from the carbon surface 100b of the N-type silicon carbide substrate 100 to form a damaged layer 304 in the LLO layer 300.

Figure 3C:
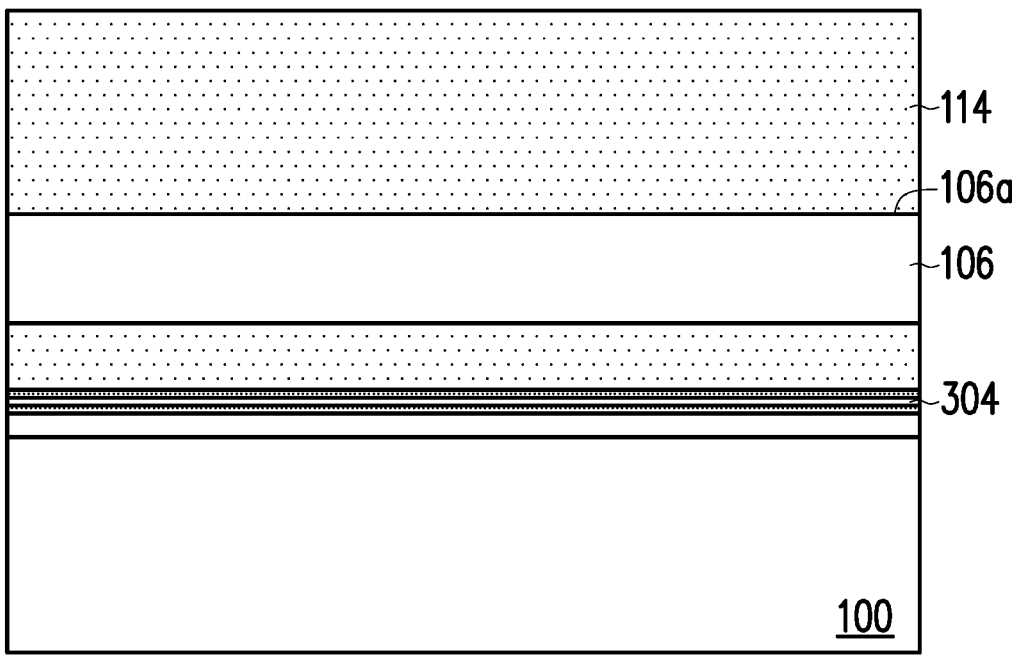

Then, referring to FIG. 3C, a chip carrier 114 is bonded to the surface 106a of the gallium nitride epitaxial layer 106.

Figure 3D:
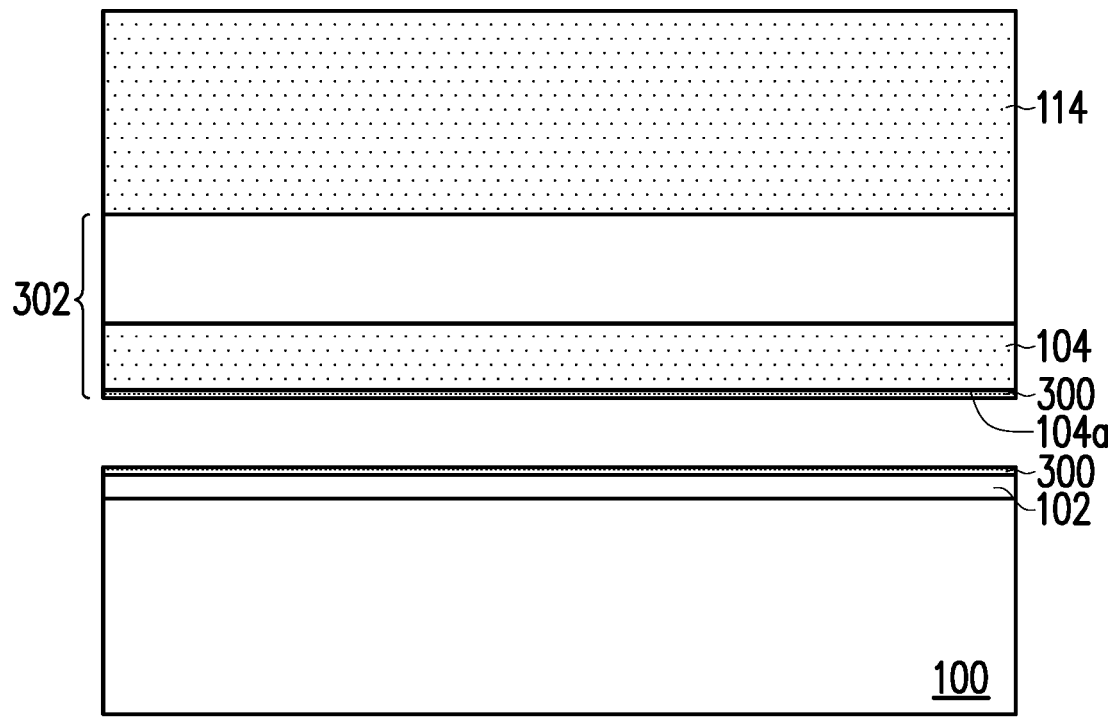

Subsequently, referring to FIG. 3D, the N-type silicon carbide substrate 100 and the semiconductor structure 302 are separated at the location of the damaged layer (304), and part of the LLO layer 300 may be left on the carbon surface 104a of the silicon carbide layer 104. Therefore, in one embodiment, the LLO layer 300 can be retained. In another embodiment, abrasion is required to remove the left LLO layer 300. Moreover, if necessary, the steps shown in FIG. 1E may be performed, that is, the step of bonding a supporting substrate (not shown) and the step of removing the chip carrier 114.

In the manufacturing process of the third embodiment, the laser 110 is used to form the damaged layer 304 for separation in the LLO layer 300 after the gallium nitride epitaxial layer 106 is grown, so not only the crystallinity quality of the silicon carbide layer 104 and the gallium nitride epitaxial layer 106 is guaranteed, but also the complete silicon carbide layer 104 and the N-type silicon carbide substrate 100 are retained. Therefore, the separated N-type silicon carbide substrate 100 can be reused, and the material cost is greatly reduced. Moreover, the resistance of the LLO layer 300 is less than that of the buffer layer 102, so the problem of lattice mismatch between the silicon carbide layer 104 and the underlying structure layer can be further improved.

FIG. 4A to FIG. 4D are schematic cross-sectional views of manufacturing a semiconductor substrate according to a fourth embodiment of the disclosure. The same or similar components are illustrated by the same numeral reference numbers as those in the first embodiment. Refer to the relevant description of the first embodiment for the description of the same or similar components, which is not iterated herein.

Figure 4A:
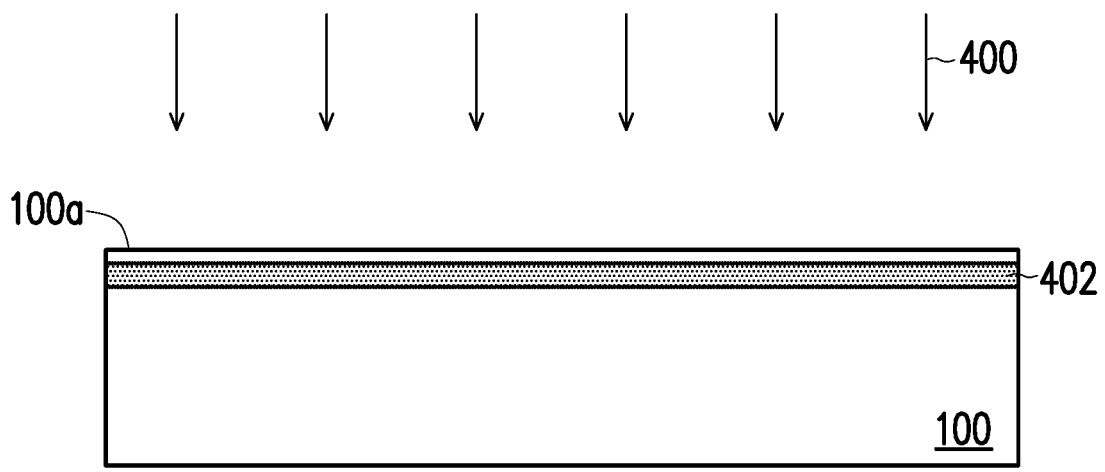
FIG. 4A to FIG. 4D are schematic cross-sectional views of manufacturing a semiconductor substrate according to a fourth embodiment of the disclosure.

Referring to FIG. 4A, ion implantation 400 is used to form a damaged layer 402 in the silicon surface 100a of an N-type silicon carbide substrate 100. Therefore, the damaged layer 402 is the ion implantation area in the N-type silicon carbide substrate 100.

Figure 4B:
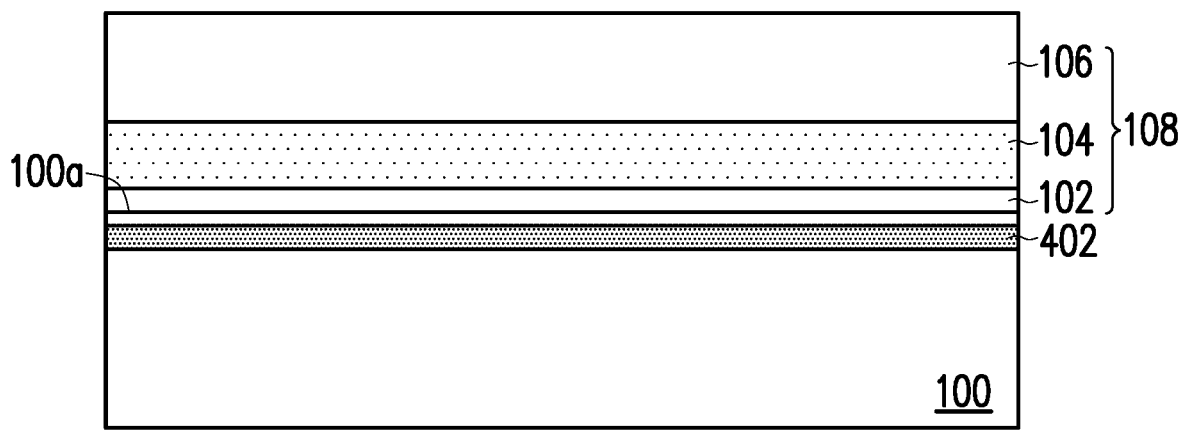

Then, referring to FIG. 4B, a buffer layer 102, a silicon carbide layer 104, and a gallium nitride epitaxial layer 106 are epitaxially grown on the silicon surface 100a of the N-type silicon carbide substrate 100, so a semiconductor structure 108 composed of the buffer layer 102, the silicon carbide layer 104, and the gallium nitride epitaxial layer 106 is obtained.

Figure 4C:
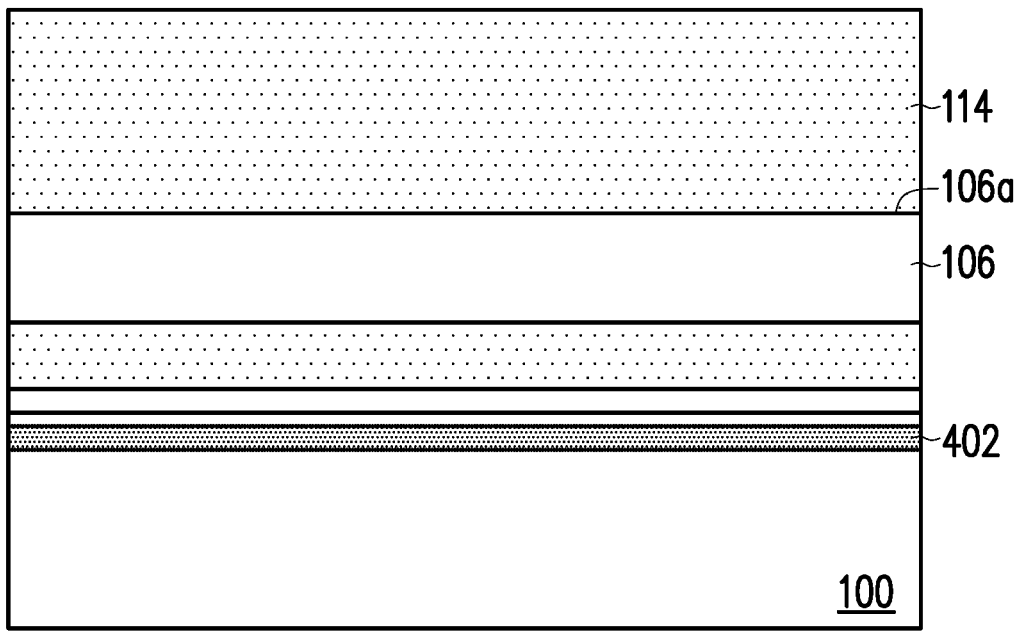

Subsequently, referring to FIG. 4C, a chip carrier 114 is bonded to the surface 106a of the gallium nitride epitaxial layer 106.

Figure 4D:
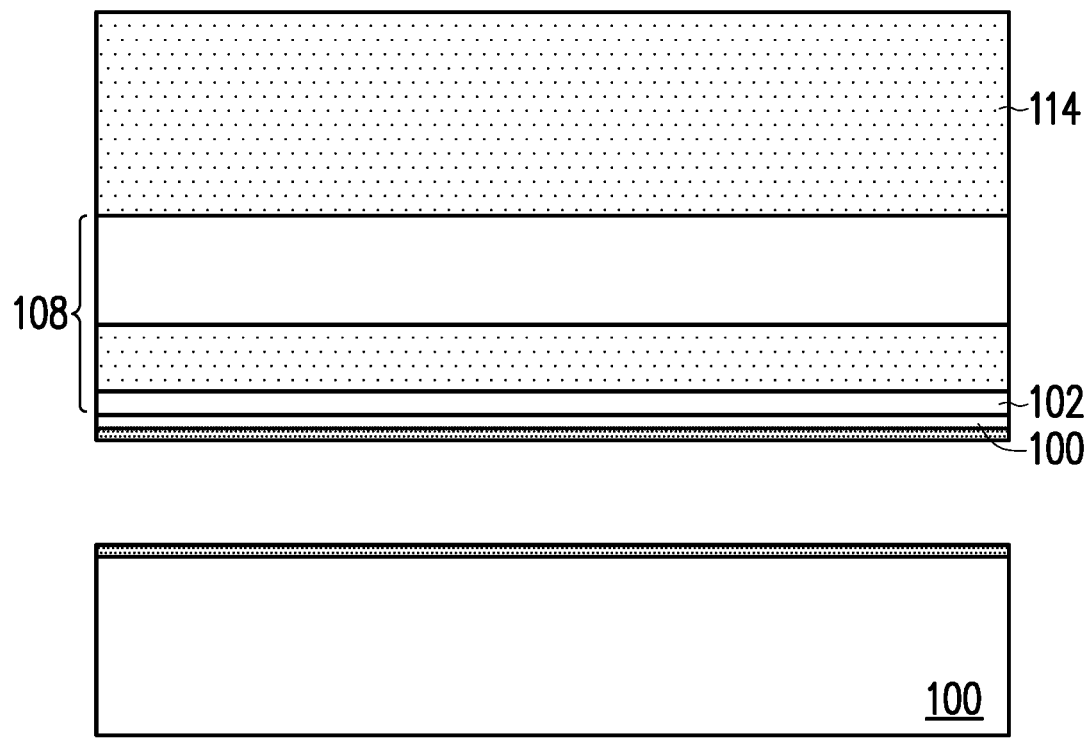

Then, referring to FIG. 4D, the N-type silicon carbide substrate 100 and the semiconductor structure 108 are separated at the location of the damaged layer 402, and part of the N-type silicon carbide substrate 100 may be left on the buffer layer 102. Therefore, in one embodiment, part of the N-type silicon carbide substrate 100 and the buffer layer 102 may be retained. In another embodiment, abrasion is required to remove the left N-type silicon carbide substrate 100 and the left buffer layer 102. Moreover, if necessary, the steps shown in FIG. 1E may be performed, that is, the step of bonding a supporting substrate (not shown) and the step of removing the chip carrier 114.

In the manufacturing process of the fourth embodiment, the ion implantation 400 is used to form the damaged layer 402 for separation in the N-type silicon carbide substrate 100 before the gallium nitride epitaxial layer 106 is grown, so not only the crystallinity quality of the silicon carbide layer 104 and the gallium nitride epitaxial layer 106 can be guaranteed, but also the separated N-type silicon carbide substrate 100 can be reused, and the material cost is greatly reduced.

Figure 5A:
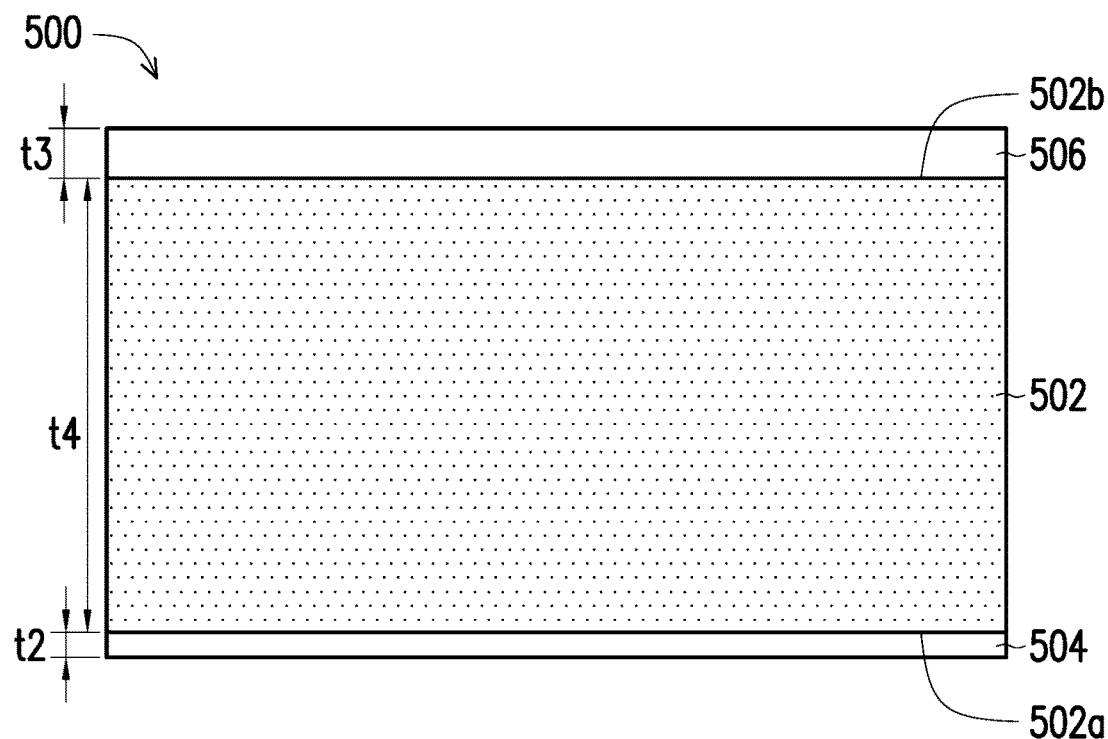
FIG. 5A is a schematic cross-sectional view of a semiconductor substrate according to a fifth embodiment of the disclosure.

FIG. 5A is a schematic cross-sectional view of a semiconductor substrate according to a fifth embodiment of the disclosure.

Referring to FIG. 5A, a semiconductor substrate 500 of the embodiment includes a high-resistivity silicon carbide layer 502, a material layer 504, and a gallium nitride epitaxial layer 506, which accordingly is adapted for semiconductor substrates with radio frequency (RF) components. The high-resistivity silicon carbide layer 502 has a first surface 502a and a second surface 502b. The first surface 502a is opposite to the second surface 502b, and the high-resistivity silicon carbide layer 502 is semi-insulating silicon carbide (SI—SiC), for example. The material layer 504 is in direct contact with the first surface 502a of the high-resistivity silicon carbide layer 502, but the disclosure is not limited thereto. In another embodiment, the semiconductor substrate may not have the material layer 504. The material layer 504 is a buffer layer, for example, and the thickness t2 of the buffer layer may be less than 1.5 μm. In one embodiment, the buffer layer is a single crystal structure and is silicon carbide having less resistance than that of the high-resistivity silicon carbide layer 502. The gallium nitride epitaxial layer 506 is formed on the second surface 502b of the high-resistivity silicon carbide layer 502, and the thickness t3 of the gallium nitride epitaxial layer 506 is less than 2 μm. Moreover, the structure of FIG. 5A can be manufactured with any method in the first embodiment to the fourth embodiment, and a step of removing left structures other than the material layer 504 can be added as required. After testing the obtained gallium nitride epitaxial layer 506, it is shown that the full width at half maximum (FWHM) of the X-ray diffraction analysis (002) plane can be less than 100 arcsec, and therefore the grown epitaxial film is verified to be of excellent quality.

In FIG. 5A, the thickness t4 of the high-resistivity silicon carbide layer 502 ranges from 20 μm to 50 μm, and the second surface 502b of the high-resistivity silicon carbide layer 502 has an angle ranging from 0° to +/−8° with respect to the (0001) plane, such as from 0° to +/−5°, and preferably from 0° to +/−3°. The micropipe density (MPD) of the high-resistivity silicon carbide layer 502 is less than 0.5 ea/cm$^2$, the basal plane dislocation (BPD) of the high-resistivity silicon carbide layer 502 is less than 10 ea/cm$^2$, and the threading screw dislocation (TSD) of the high-resistivity silicon carbide layer 502 is less than 500 ea/cm$^2$. The resistance of the high-resistivity silicon carbide layer 502 is greater than 1E5 ohm-cm. The resistance variation rate of the high-resistivity silicon carbide layer 502 is less than 50%, for example. The so-called "resistance variation rate" refers to the result of dividing the resistance standard deviation by the resistance average value.

Figure 5B:
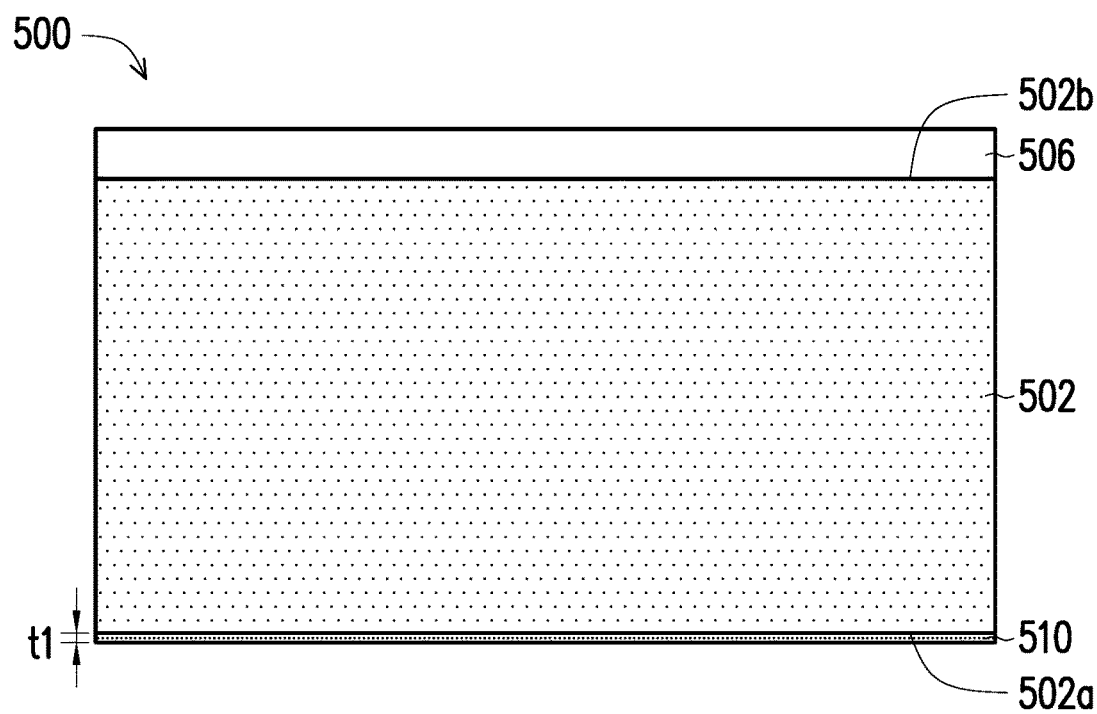
FIG. 5B is a schematic cross-sectional view of another semiconductor substrate of the fifth embodiment.

FIG. 5B is a schematic cross-sectional view of another semiconductor substrate of the fifth embodiment. The same or similar components are illustrated by the same numeral reference numbers as those in FIG. 5A. Refer to the relevant description of FIG. 5A for the description of the same or similar components, which is not iterated herein.

In FIG. 5B, the material layer in the semiconductor substrate 500 is a laser lift off (LLO) layer 510 disposed on the first surface 502a of the high-resistivity silicon carbide layer 502 and is in direct contact with the first surface 502a. The LLO layer 510 may be silicon carbide doped with aluminum. In one embodiment, the concentration of the doped aluminum of the LLO layer 510 is greater than 1E20 $cm^{-3}$, for example, and the thickness t1 of the LLO layer 510 ranges from 1.0 nm to 10 nm, for example. The structure of FIG. 5B can be manufactured using the third embodiment.

Figure 5C:
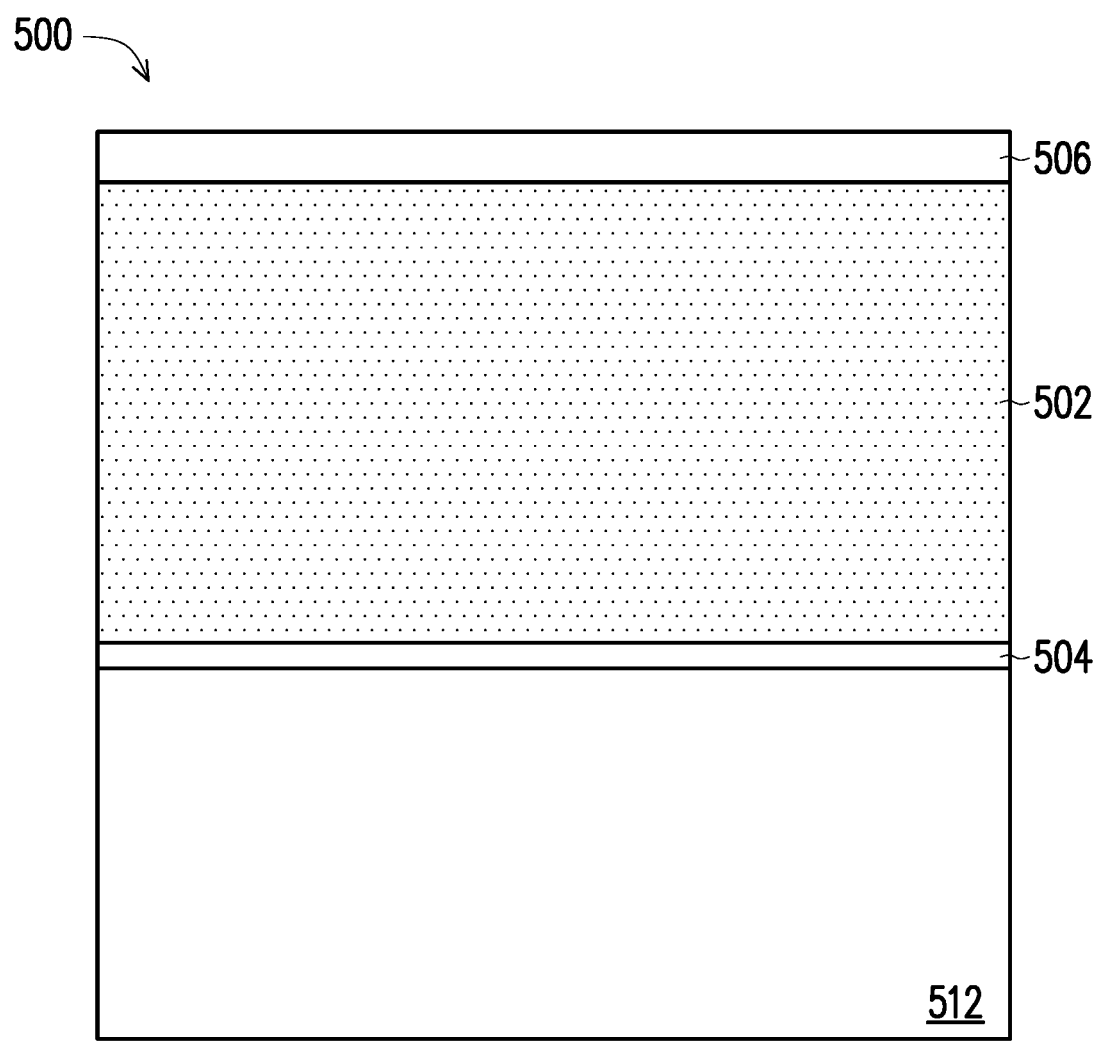
FIG. 5C is a schematic cross-sectional view of still another semiconductor substrate of the fifth embodiment.

FIG. 5C is a schematic cross-sectional view of still another semiconductor substrate of the fifth embodiment. The same or similar components are illustrated by the same numeral reference numbers as those in FIG. 5A. Refer to the relevant description of FIG. 5A for the description of the same or similar components, which is not iterated herein.

In FIG. 5C, the semiconductor substrate 500 may further include a supporting substrate 512 bonded to the exposed surface of the material layer 504 (the buffer layer). The supporting substrate 512 is a silicon substrate, a silicon-on-insulator (SOI) substrate, a ceramic substrate, or a glass substrate, for example.

Figure 6A:
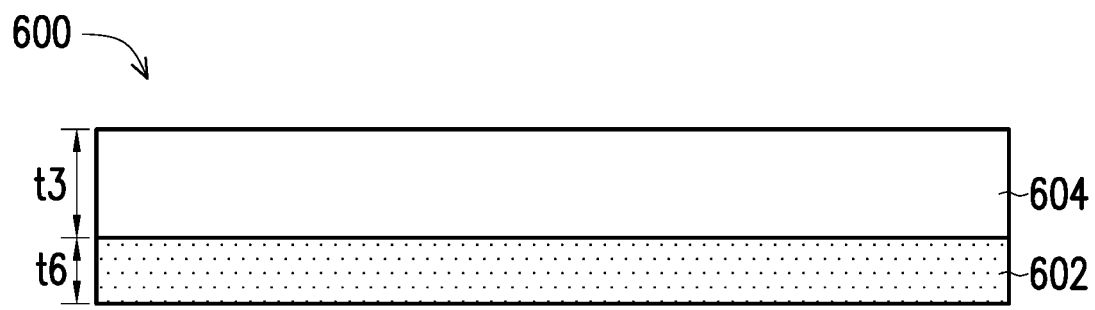
FIG. 6A is a schematic cross-sectional view of a semiconductor substrate according to a sixth embodiment of the disclosure.

FIG. 6A is a schematic cross-sectional view of a semiconductor substrate according to a sixth embodiment of the disclosure.

Referring to FIG. 6A, the semiconductor substrate 600 of the embodiment includes an N-type silicon carbide (N—SiC) layer 602 and a gallium nitride epitaxial layer 604 and accordingly is adapted for semiconductor substrates with power devices. The gallium nitride epitaxial layer 604 is formed on the surface of the N—SiC layer 602, the thickness t3 of the gallium nitride epitaxial layer 604 ranges from 0.3 μm to 6 μm, the structure of FIG. 6A can be manufactured with any method in the first embodiment to the fourth embodiment, and a step of removing left structures other than the N—SiC layer 602 can be added as required. After testing the obtained gallium nitride epitaxial layer 604, it is shown that the full width at half maximum (FWHM) of the X-ray diffraction analysis (002) plane is less than 100 arcsec. The thickness t6 of the N—SiC layer 602 ranges from 0.1 μm to 50 μm, and the surface of the N—SiC layer 602 has an angle ranging from 0° to +/−8° with respect to the (0001) plane, the micropipe density (MPD) of the N—SiC layer 602 is less than 0.5 ea/cm², the basal plane dislocation (BPD) of the N—SiC layer 602 is less than 10 ea/cm², and the threading screw dislocation (TSD) of the N—SiC layer 602 is less than 500 ea/cm². In an embodiment, the resistance of the N—SiC layer 602 ranges from 1E15 $cm^{-3}$ to 1E20 $cm^{-3}$, for example. The resistance variation rate of the N—SiC layer 602 is less than 5%.

Figure 6B:
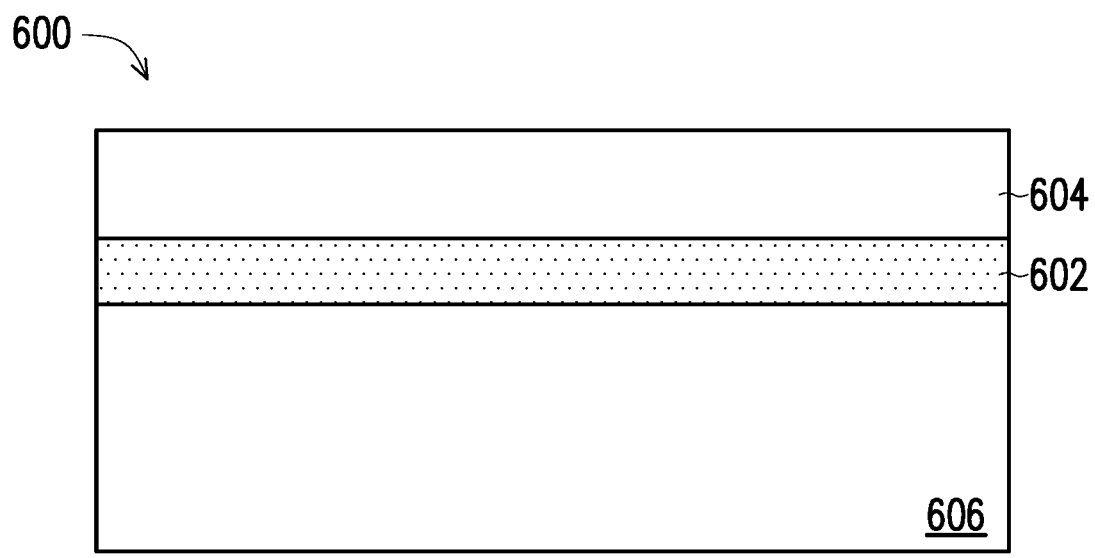
FIG. 6B is a schematic cross-sectional view of another semiconductor substrate of the sixth embodiment.

FIG. 6B is a schematic cross-sectional view of another semiconductor substrate of the sixth embodiment. The same or similar components are illustrated by the same numeral reference numbers as those in FIG. 6A. Refer to the relevant description of FIG. 6A for the description of the same or similar components, which is not iterated herein.

In FIG. 6B, the semiconductor substrate 600 may further include a supporting substrate 606 bonded to the exposed surface of the N—SiC layer 602. The supporting substrate 606 is a silicon substrate, a silicon-on-insulator (SOI) substrate, a ceramic substrate, or a glass substrate, for example.

Based on the above, in the disclosure, by the current epitaxial process, a silicon carbide layer, a buffer layer, and a gallium nitride epitaxial layer are sequentially epitaxially grown on a silicon carbide substrate. Moreover, along with a variety of methods for forming a damaged layer between the silicon carbide substrate and the silicon carbide layer, not only can gallium nitride with good crystallinity be grown, but also a majority of the silicon carbide substrate can be retained because of the existence of the damaged layer, so the silicon carbide substrate can be reused, and the substrate cost can be further reduced.

Although the disclosure has been described with reference to the above embodiments, they are not intended to limit the disclosure. It will be apparent to one of ordinary skill in the art that modifications and changes to the described embodiments may be made without departing from the spirit and the scope of the disclosure. Accordingly, the scope of the disclosure will be defined by the attached claims and their equivalents and not by the above detailed descriptions.

What is claimed is:

1. A method of manufacturing a semiconductor substrate comprising:
    epitaxially growing a buffer layer and a silicon carbide layer on a silicon surface of an N-type silicon carbide substrate, wherein the silicon carbide layer is high-resistivity silicon carbide or N-type silicon carbide (N—SiC);
    epitaxially growing a gallium nitride epitaxial layer on the silicon carbide layer to obtain a semiconductor structure composed of the buffer layer, the silicon carbide layer, and the gallium nitride epitaxial layer;
    using a laser to form a damaged layer in the semiconductor structure after epitaxially growing the gallium nitride epitaxial layer;
    bonding a chip carrier on a surface of the gallium nitride epitaxial layer; and
    separating the N-type silicon carbide substrate and the semiconductor structure at where the damaged layer is disposed.

2. The method of manufacturing the semiconductor substrate according to claim 1, wherein the method of forming the damaged layer comprises applying the laser to the buffer layer from the surface of the gallium nitride epitaxial layer to form the damaged layer in the buffer layer.

3. The method of manufacturing the semiconductor substrate according to claim 1, wherein the method of forming the damaged layer comprises applying the laser from a carbon surface of the N-type silicon carbide substrate to the silicon surface of the N-type silicon carbide substrate to form the damaged layer in the N-type silicon carbide substrate.

4. The method of manufacturing the semiconductor substrate according to claim 1, further comprising epitaxially growing a laser lift off (LLO) layer after the buffer layer is epitaxially grown and before the silicon carbide layer is epitaxially grown, wherein the laser lift off (LLO) layer is silicon carbide doped with aluminum, a concentration of the doped aluminum of the laser lift off (LLO) layer is greater than 1E20 $cm^{-3}$, and a thickness of the laser lift off (LLO) layer ranges from 1.0 nm to 10 nm.

5. The method of manufacturing the semiconductor substrate according to claim 4, wherein the method of forming the damaged layer comprises applying the laser to the laser lift off (LLO) layer from a carbon surface of the N-type silicon carbide substrate to form the damaged layer in the laser lift off (LLO) layer.

6. The method of manufacturing the semiconductor substrate according to claim 1, wherein the silicon surface of the N-type silicon carbide substrate comprises an angle ranging from 0° to +/−8° with respect to a (0001) surface.

7. The method of manufacturing the semiconductor substrate according to claim 1, wherein after separating the N-type silicon carbide substrate and the semiconductor structure, the method further comprises removing the buffer layer.

8. The method of manufacturing the semiconductor substrate according to claim 7, further comprising bonding a supporting substrate to the silicon carbide layer, wherein the supporting substrate comprises a silicon substrate, a silicon-on-insulator (SOI) substrate, a ceramic substrate, or a glass substrate.

9. The method of manufacturing the semiconductor substrate according to claim 8, wherein after bonding the supporting substrate, the method further comprises removing the chip carrier.

10. The method of manufacturing the semiconductor substrate according to claim 1, wherein after separating the N-type silicon carbide substrate and the semiconductor structure, the method further comprises bonding a supporting substrate on a surface of the buffer layer, and the supporting substrate comprises a silicon substrate, a silicon-on-insulator (SOI) substrate, a ceramic substrate, or a glass substrate.

11. The method of manufacturing the semiconductor substrate according to claim 10, wherein after bonding the supporting substrate, the method further comprises removing the chip carrier.

12. The method of manufacturing the semiconductor substrate according to claim 1, wherein a material of the chip carrier comprises glass or sapphire.

13. A method of manufacturing a semiconductor substrate, comprising:
using ion implantation to form a damaged layer on a silicon surface of an N-type silicon carbide substrate;
epitaxially growing a buffer layer and a silicon carbide layer on the silicon surface of the N-type silicon carbide substrate after the damaged layer is formed, wherein the silicon carbide layer is high-resistivity silicon carbide or N-type silicon carbide (N—SiC);
epitaxially growing a gallium nitride epitaxial layer on the silicon carbide layer to obtain a semiconductor structure composed of the buffer layer, the silicon carbide layer, and the gallium nitride epitaxial layer;
bonding a chip carrier on a surface of the gallium nitride epitaxial layer; and
separating the N-type silicon carbide substrate and the semiconductor structure at where the damaged layer is disposed.

14. The method of manufacturing the semiconductor substrate according to claim 13, wherein the silicon surface of the N-type silicon carbide substrate has an angle ranging from 0° to +/−8° with respect to a (0001) surface.

15. The method of manufacturing the semiconductor substrate according to claim 13, wherein after separating the N-type silicon carbide substrate and the semiconductor structure, the method further comprises removing the buffer layer.

16. The method of manufacturing the semiconductor substrate according to claim 15, further comprising bonding a supporting substrate to the silicon carbide layer, wherein the supporting substrate comprises a silicon substrate, a silicon-on-insulator (SOI) substrate, a ceramic substrate, or a glass substrate.

17. The method of manufacturing the semiconductor substrate according to claim 16, wherein after bonding the supporting substrate, the method further comprises removing the chip carrier.

18. The method of manufacturing the semiconductor substrate according to claim 13, wherein after separating the N-type silicon carbide substrate and the semiconductor structure, the method further comprises bonding a supporting substrate on a surface of the buffer layer, and the supporting substrate comprises a silicon substrate, a silicon-on-insulator (SOI) substrate, a ceramic substrate, or a glass substrate.

19. The method of manufacturing the semiconductor substrate according to claim 18, wherein after bonding the supporting substrate, the method further comprises removing the chip carrier.

20. The method of manufacturing the semiconductor substrate according to claim 13, wherein a material of the chip carrier comprises glass or sapphire.

* * * * *